(12) United States Patent
Taniguchi

(10) Patent No.: US 8,202,802 B2
(45) Date of Patent: Jun. 19, 2012

(54) METHOD OF FABRICATING SEMICONDUCTOR DEVICE

(75) Inventor: Kensuke Taniguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/328,331

(22) Filed: Dec. 16, 2011

(65) Prior Publication Data

US 2012/0094497 A1    Apr. 19, 2012

Related U.S. Application Data

(62) Division of application No. 12/205,950, filed on Sep. 8, 2008, now Pat. No. 8,124,542.

(30) Foreign Application Priority Data

Sep. 7, 2007    (JP) .................................. 2007-232629

(51) Int. Cl.
    *H01L 21/44*    (2006.01)
(52) U.S. Cl. ................. 438/672; 257/E21.486
(58) Field of Classification Search .......... 438/671–673, 438/950; 257/E21.486
    See application file for complete search history.

(56) References Cited

U.S. PATENT DOCUMENTS

| | | | |
|---|---|---|---|
| 6,071,806 A * | 6/2000 | Wu et al. ........................ | 438/622 |
| 6,653,228 B2 | 11/2003 | Choi et al. | |
| 6,938,238 B2 | 8/2005 | Okagawa et al. | |
| 7,094,672 B2 * | 8/2006 | Chen et al. ..................... | 438/586 |
| 7,288,475 B2 * | 10/2007 | Gambino et al. ............. | 438/623 |
| 2005/0245075 A1 * | 11/2005 | Arita et al. ..................... | 438/638 |
| 2007/0281491 A1 | 12/2007 | Kamp | |
| 2008/0064203 A1 | 3/2008 | Chou et al. | |
| 2008/0122109 A1 * | 5/2008 | Yang et al. ..................... | 257/774 |

FOREIGN PATENT DOCUMENTS

| | | |
|---|---|---|
| JP | 2002-141336 | 5/2002 |
| JP | 2002-198362 | 7/2002 |
| JP | 2004-103999 | 4/2004 |
| JP | 2005-166884 | 6/2005 |
| JP | 2006-41364 | 2/2006 |
| JP | 2006-156657 | 6/2006 |

* cited by examiner

*Primary Examiner* — Kiesha Bryant
*Assistant Examiner* — Ali Naraghi
(74) *Attorney, Agent, or Firm* — Young & Thompson

(57) ABSTRACT

The present method includes: forming a device isolation region in a substrate dividing the device isolation region into first and second diffusion regions; forming a target film to be processed on the substrate; forming a hard mask layer and a first resist layer on the film; forming a first pattern on the first resist layer; etching the hard mask layer using the first pattern as a mask; forming a second resist layer on the hard mask layer; forming a second pattern including a first space on the second resist layer isolating the first pattern; forming a third pattern including a second space shrunk from the first space on the hard mask layer by carrying out size conversion etching by using the second pattern formed on the second resist layer as a mask; and etching the film to be processed by using the third pattern formed on the hard mask layer.

8 Claims, 15 Drawing Sheets

METHOD OF FABRICATING SEMICONDUCTOR DEVICE

CROSS REFERENCE TO RELATED APPLICATIONS

This application is a division of co-pending application Ser. No. 12/205,950 filed on Sep. 8, 2008, which claims foreign priority to Japanese Patent application No. 2007-232629 filed on Sep. 7, 2007. The entire content of each of these applications is hereby expressly incorporated by reference.

BACKGROUND OF THE INVENTION

The present invention relates to a method of fabricating a semiconductor device. In more particular, the present invention relates to a method of fabricating a semiconductor device with a high-degree of integration, and relates to a fine pattern formation method of separates interconnect pattern in devices such as transistors by using dimension control technique.

In recent years, there is a continuing trend of manufacturing semiconductor devices which are finer and finer and more and more integrated. This scaling-trend results in shorter gate lengths in MOS transistors mounted on LSI circuits and shorter distance and smaller pitch of mutually adjacent wirings. Similarly, also for memory cell such as of an SRAM mounted on LSI circuits, there is a demand for reduction in bit costs by increasing packing density. Therefore, resolution enhancement technique (RET) such as an alternative phase-shifting mask (e.g. Levenson phase shift mask) technology is used to meet the demand for size reduction. However, the changing of the demand for size reduction of the semiconductor device is faster than improvement of resolution in lithography. Therefore, instead of the resolution improvement in lithography, resist trimming process which decrease photoresist pattern size by isotropic dry-etching of patterned photoresist (e.g. for a gate electrode arranged in line-and-space) is in practical use to make fine patterns that is below the resolution limit of the current lithography. Japanese Patent Laid-Open No. 2004-103999 discloses a technology of forming a fine pattern for LSI circuit, by forming a first pattern and then forming a fine space pattern to become a second pattern through exposure and development. On the other hand, Japanese Patent Laid-Open No. 2005-166884 carries out processing on film to be processed with a space control film and a resist mask for forming a fine space superior to a space which the lithographic resolution technology attains.

Japanese Patent Laid-Open No. 2006-41364 discloses a method of forming wirings wherein an anti-reflective coating film is etched with gas consisted of CHF3, CF4 and O2. The document specifies that etching on an anti-reflective coating film with etching gas of CHF3:O2=1:1 to 9:1 enables etching without changing the pattern size.

Japanese Patent Laid-Open No. 2006-156657 discloses a technology of forming a fine pattern below resolution limit of lithography, by forming a first pattern on an electrically conductive film within lithography resolution and then trimming this first pattern by dry-etching. (FIG. 9)

Japanese Patent Laid-Open No. 2002-198362 and Japanese Patent Laid-Open No. 2002-141336 disclose a method of forming a contact hole by using mixing gas of O2 (etching agent) and added gas enhancing deposition such as CH2F2 or CHF3. In the document, it is described to adjust CH2F2 gas flow to control the diameter of the contact hole.

However, the present inventor has found out problems to be described below. Desired properties of semiconductor devices are unavailable since displacement takes place in a portion requiring overlapping between wiring pattern and its upper or lower conductor layer which is connecting to the wiring pattern when displacement in a second pattern occurs at the occasion of forming a wiring pattern by dividing the first pattern with the second pattern.

SUMMARY

In one aspect, the present invention includes the steps of: forming an device isolation region in a substrate to divide the diffusion region into a first and a second regions; forming a film to be processed on the substrate; forming a hard mask layer and a first resist layer on the film to be processed; forming a first pattern on the first resist layer; etching the hard mask layer by using the first pattern as a mask; forming a second resist layer on the hard mask layer; forming a second pattern including a first space (to divide the first pattern) on the second resist layer; forming a third pattern including a second space shrunk from the first space on the hard mask layer by carrying out size conversion etching by using the second pattern formed on the second resist layer as a mask; and etching the film to be processed by using the third pattern formed on the hard mask layer.

In another aspect, the present invention includes the steps of: forming a film to be processed on a substrate; forming a hard mask layer and a first resist layer on the film to be processed; forming a first pattern on the first resist layer; etching the hard mask layer by using the first pattern as a mask; forming a second resist layer on the hard mask layer; forming a second pattern including a first space (to divide the first pattern) on the second resist layer; forming a third pattern including a second space shrunk from the first space on the hard mask layer by carrying out size conversion etching by using the second pattern formed on the second resist layer as a mask; etching the film to be processed by using the third pattern formed on the hard mask layer to form a first wiring pattern and a second wiring pattern; forming an interlayer insulating film on the film to be processed; and forming a first and a second contact holes bringing the first wiring pattern and the second wiring pattern respectively into connection to the interlayer film.

BRIEF DESCRIPTION OF THE DRAWINGS

The above and other objects, advantages and features of the following description taken in conjunction with the accompanying drawings, in which.

DETAILED DESCRIPTION OF PREFERRED EMBODIMENTS

A preferable embodiment of a method of fabricating a semiconductor device according to the present invention will be described with reference to the drawings and illustrative embodiments. Here, like numerals denote like elements to omit overlapping description on the drawings. Those skilled in the art will recognize that many alternative embodiments can be accomplished using the teachings of the present invention and that the invention is not limited to the embodiments illustrated for explanatory purposes.

First Embodiment

FIG. 1 is a cross-sectional view illustrating an embodiment of a method of fabricating a semiconductor device according to the present invention.

Figure 1A:
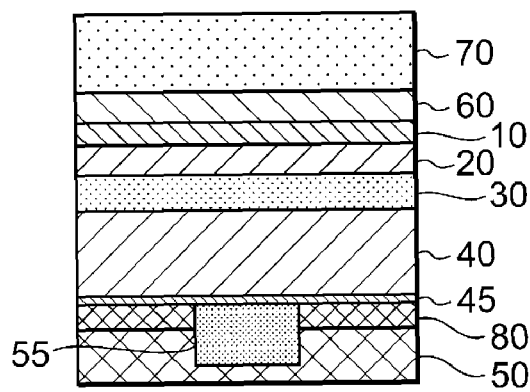
FIGS. 1(A) to 1(D) are cross-sectional views illustrating a method of fabricating a semiconductor device according to an embodiment of the present invention.
Figure 1B:
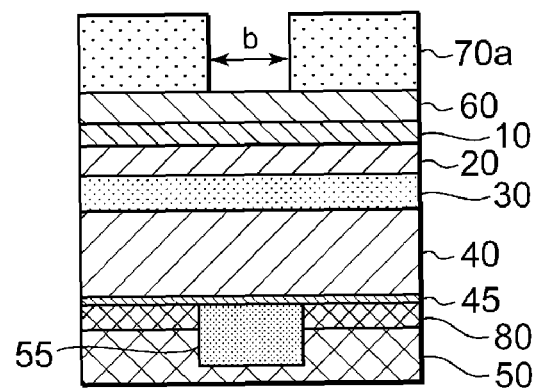
Figure 1C:
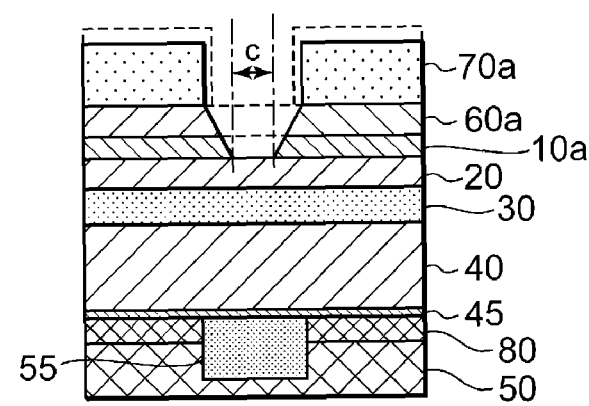
Figure 1D:
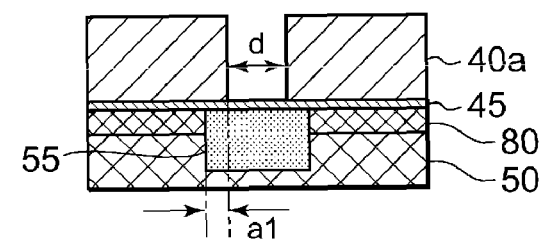

A method of fabricating semiconductor devices of the present embodiment includes a processing a mask layer 10 on a substrate 50 by using a resist 70a including a first pattern to attain a second pattern (FIGS. 1(A) to 1(C)), and etching a wiring layer 40 formed on a substrate 50 by using the mask layer 10a processed to the second pattern as a mask (FIG. 1(D)). Here, the space width c of the second pattern is processed to get narrower than the space width b of the first pattern.

The respective steps in the method of fabricating semiconductor devices in the present embodiment will be described below.

At first, as illustrated in FIG. 1(A), diffusion regions 80 are formed in a predetermined pitch. A gate insulating film 45 is formed on a substrate 50 where device isolation (STI) region (oxide film) 55 is formed between the diffusion regions 80. Next, a polysilicon film 40 as a wiring layer is formed on this gate insulating film 45. Next, a first hard mask layer 30, a second hard mask layer 20 and a third hard mask layer 10 are formed in this order on this polysilicon film 40. Next, an anti-reflective coating (ARC) film 60 is formed on the third hard mask layer 10. Next, a resist (for example, an ArF resist) 70 is applied and deposited. Next, this resist is exposed to the ArF light and developed by using a photomask (not illustrated in the drawing) including a first pattern. Thereby, a resist 70a including a first pattern is formed as illustrated in FIG. 1(B). During the unit to form the resist 70a including this first pattern, a region of an immediately upper portion to be removed in the polysilicon film 40 in the resist 70 is removed to provide a width b.

SiOC, SiO2, SiON, SiN, SiC, SiOF or SiCN, for example, can be used as the first, second and third hard mask layers 30, 20 and 10.

Next, as illustrated in FIG. 1(C), an anti-reflective coating film 60 and the third hard mask layer 10 are etched by using a resist 70a as a mask where the first pattern is transferred. Thereby, the second hard mask layer 20 is exposed and the third hard mask layer 10a including the second pattern is formed. Here, the third hard mask layer 10a is etched to get a space width c which is narrower than the space width b of the resist 70a.

Etching gas usable for etching includes fluorocarbon gas expressed by CxHyFz (x=1 to 5, y=0 to 3, z=1 to 8) or its mixture. Preferably CHF3 or CH2F2 and, otherwise, mixed gas thereof is used as such fluorocarbon gas. In addition to such fluorocarbon gas, one or more kinds of gases selected from the group of He, Ar, O2, N2 and CF4 can be used.

Next, as illustrated in FIG. 1(D), the third hard mask layer 10a including the second pattern is masked so that the remaining resist 70a, the remaining anti-reflective coating film 60a, the second hard mask layer 20, the first hard mask layer 30 and the wiring layer 40 are etched. Thereby, the gate insulating film 45 is exposed and the wiring layer 40a with a space width d is formed. The space width d is approximately equal to the space width c. The space width d of the wiring layer is processed to be smaller than the space width b so that the wiring protruding dimension will become a1. Thus, the distance between the wiring end and the diffusion region can be secured sufficiently.

Figure 10A:
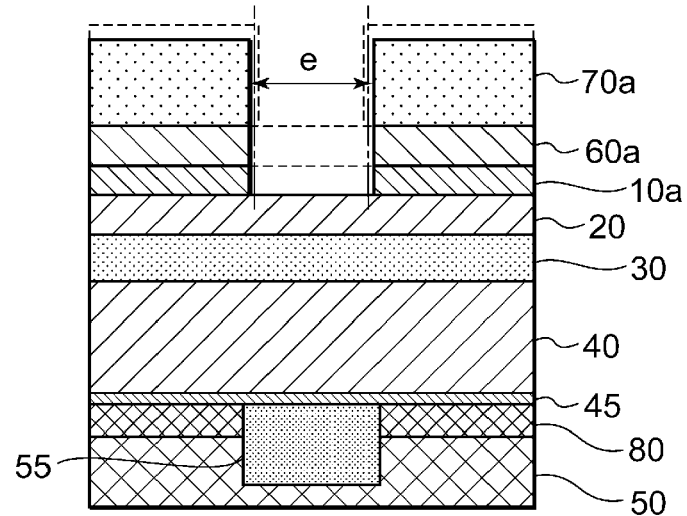
FIG. 10(A) and FIG. 10(B) are cross-sectional views of diagrams illustrating a method of fabricating a conventional semiconductor device.
Figure 10B:
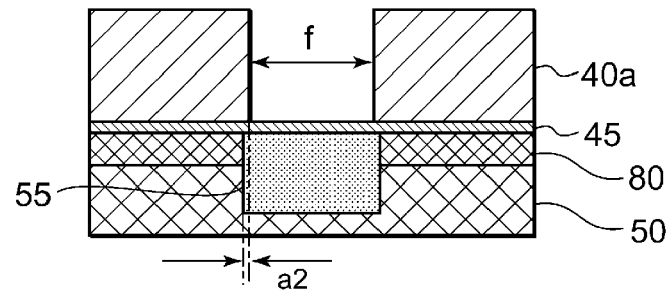

Here, the method of fabricating the present embodiment will be compared with the method of fabricating the prior arts. FIGS. 10(A) and 10(B) are cross-sectional views illustrating etching steps of the prior arts. In the prior arts, etching is carried out with the resist 70a with the space width e as a mask. At the occasion of forming the third hard mask layer 10a, the space width of the third hard mask layer 10a to be obtained will be e (FIG. 10(A)). Accordingly, the wiring layer 40 is etched with this third hard mask layer 10a as a mask and, then, a wiring layer 40a including a space width f approximately equal to e is formed (FIG. 10(B)). In that case, the wiring protruding dimension a2 cannot be secured sufficiently.

On the other hand, the present invention can make the space width d of the wiring layer 40a narrower than the space width b of the resist 70a (FIG. 1). Thereby, wiring isolation with a pattern which is finer than the pattern of the resist can be carried out.

Second Embodiment

For the present embodiment, a method of fabricating a cell will be described with a method of fabricating the semiconductor device illustrated in FIG. 1. In the present embodiment, a case of forming SRAM counter gate electrodes by causing the wiring layer to undergo wiring isolation by being subjected to trim etching on the wiring layer in a circuit with the distance between the diffusion regions 80 illustrated in FIG. 1(A) being 200 nm will be described.

Figure 2:
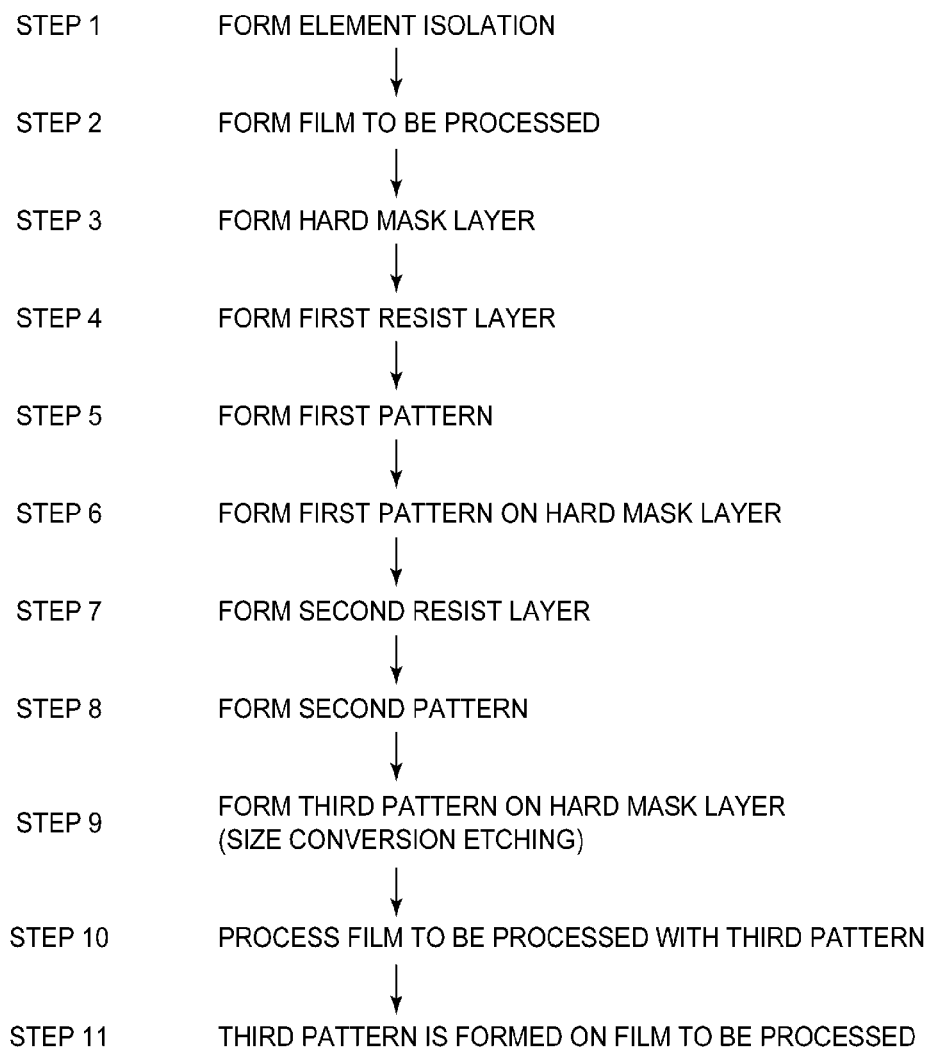
FIG. 2 illustrates a process flow of a second embodiment of the present invention.
Figure 3A:
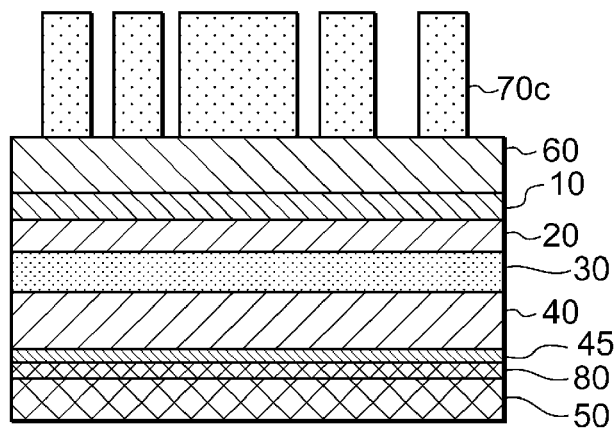
FIGS. 3(A) to 3(C) are cross-sectional views illustrating a method of fabricating a semiconductor device according to an embodiment of the present invention.
Figure 3B:
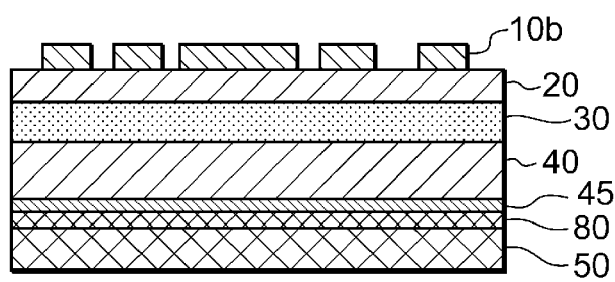
Figure 3C:
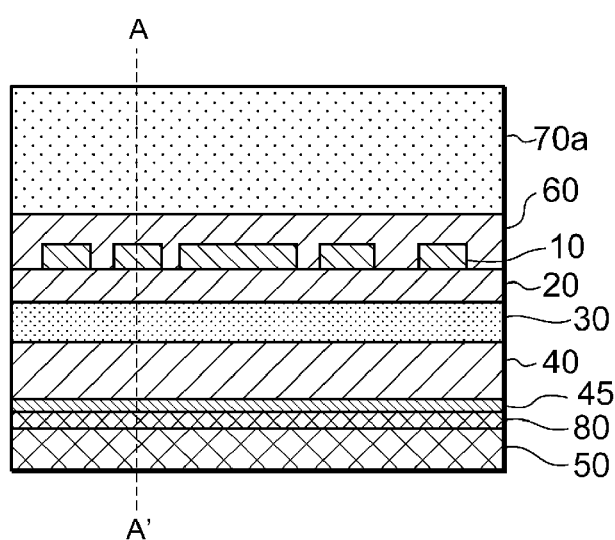
Figure 4A:
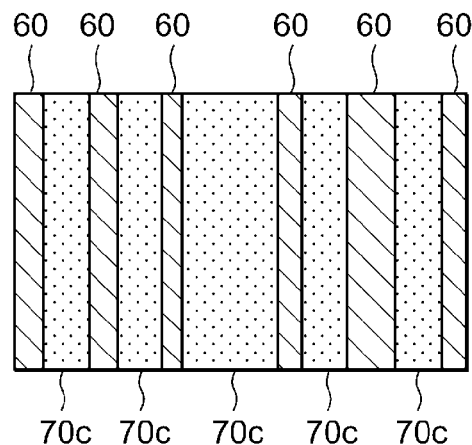
FIGS. 4(A) to 4(C) are top views illustrating a method of fabricating a semiconductor device according to an embodiment of the present invention.
Figure 4B:
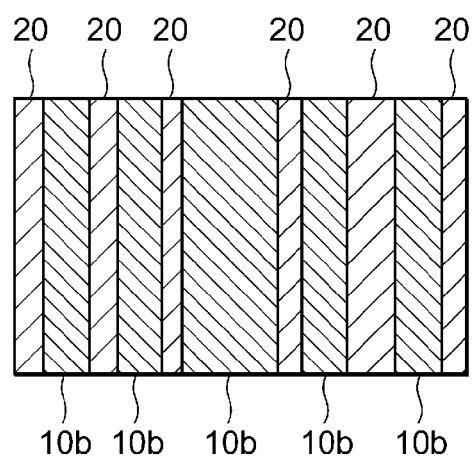
Figure 4C:
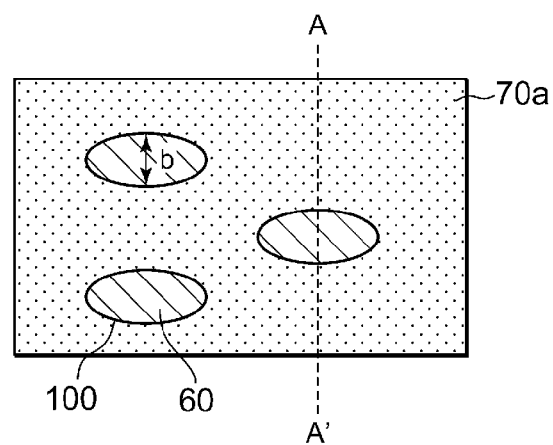
Figure 5A:
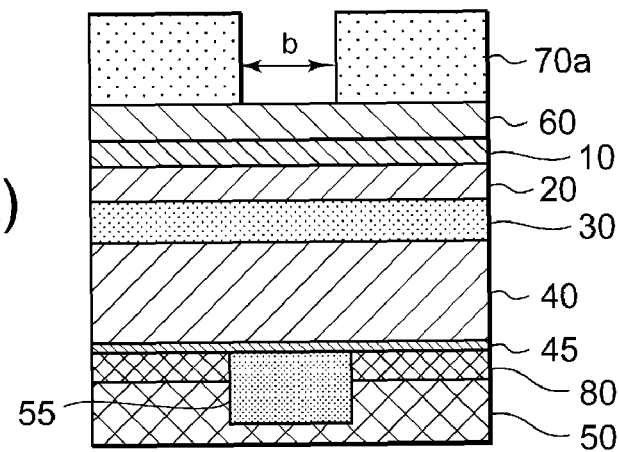
FIGS. 5(A) to 5(C) are cross-sectional views illustrating a method of fabricating a semiconductor device according to an embodiment of the present invention.
Figure 5B:
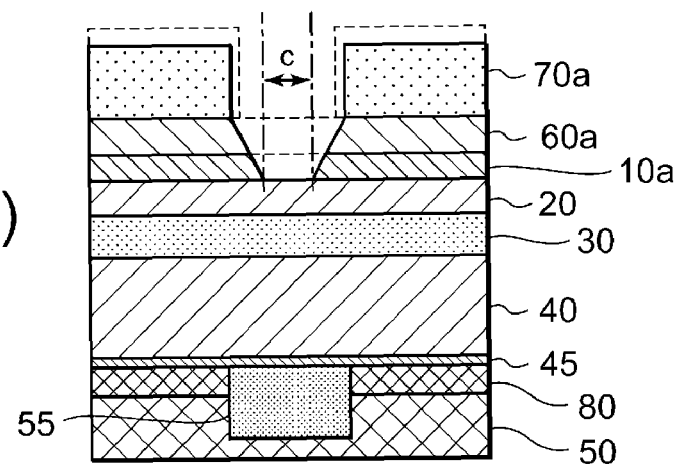

FIG. 2 illustrates a process flow of a method of fabricating a semiconductor device of the present embodiment. In addition, FIG. 3 and FIG. 5 are cross-sectional views illustrating flow of the steps, wherein FIG. 4 is a top view corresponding to FIG. 3 and FIG. 6 is a top view corresponding to FIG. 5. Here, the cross-sectional views are significantly different depending on the cutting sites. Therefore, taking FIG. 3 as the cross-sectional view in the X direction of the substrate, FIG. 5 is the cross-sectional view in the Y direction, for example. In addition, for the purpose of description, FIG. 3(C) (FIG. 4(C)) and FIG. 5(A) (FIG. 6(A)) are drawings of the same step with different cross-sectional faces. The cross-sectional view along the line A-A' corresponds to FIG. 5(A).

Figure 5C:
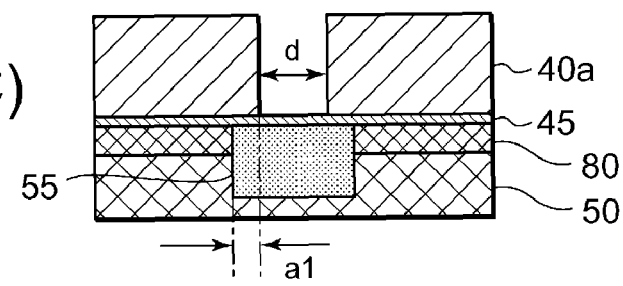
Figure 6A:
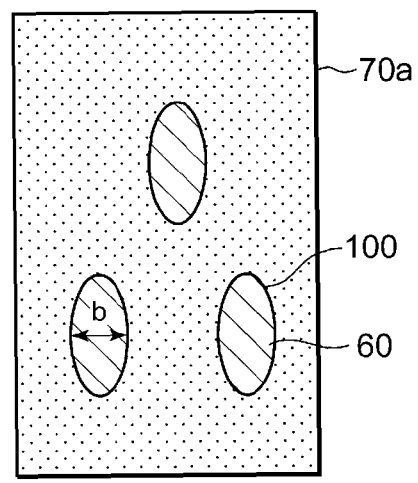
FIGS. 6(A) to 6(C) are top views illustrating a method of fabricating a semiconductor device according to an embodiment of the present invention.
Figure 6B:
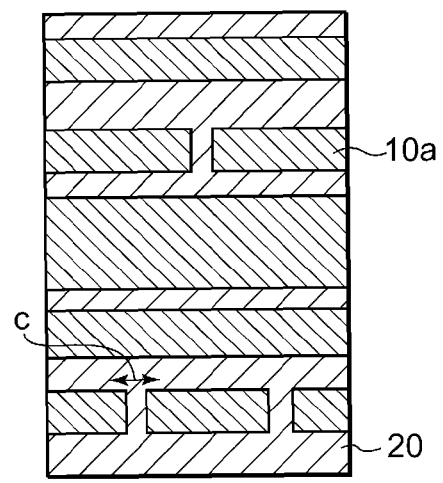
Figure 6C:
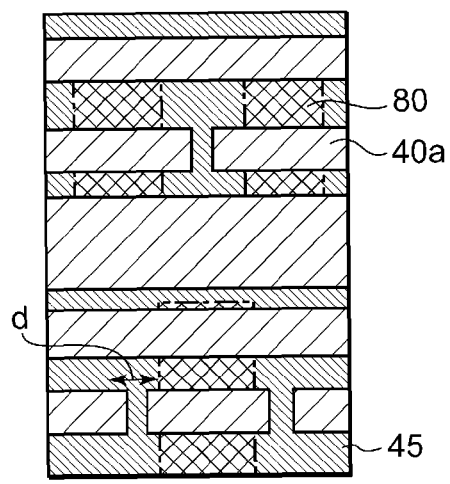
Figure 7A:
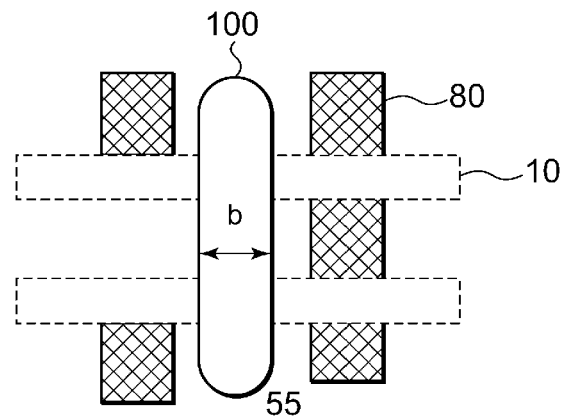
FIGS. 7(A) to 7(C) are top views illustrating a method of fabricating a semiconductor device according to an embodiment of the present invention.
Figure 7B:
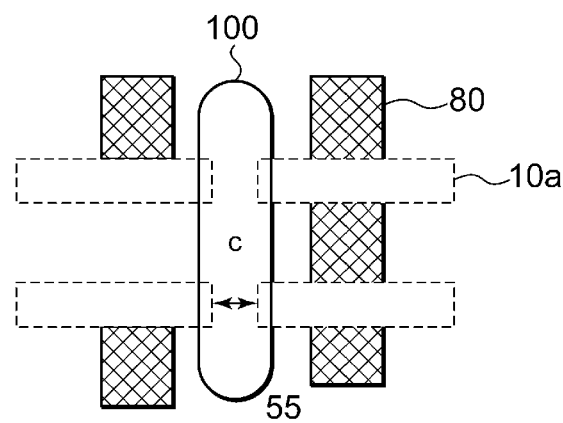
Figure 7C:
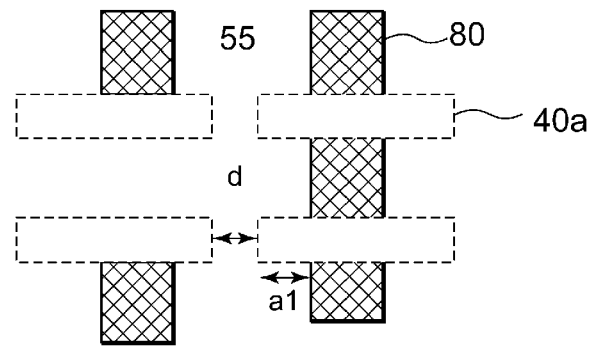

FIGS. 7(A) to 7(C) are top views of FIGS. 1(B) to 1(D) or FIGS. 5(A) to 5(C) respectively and correspond to FIGS. 6(A) to 6(C). For the purpose of description, in FIG. 7, a diffusion region layer 80, a hard mask layer 10, an opening 100 of a second pattern 70, a third pattern 40a which is formed on a film to be processed are illustrated.

A method of processing the film to be processed will be described according to FIG. 2 with reference to FIG. 3 to FIG. 7 including cross-sectional views and top views. In a substrate, device isolation 55 is formed and diffusion region 80 is divided into a first diffusion region and a second diffusion region (80). (STEP 1) After a gate insulating film 45 is formed on this substrate, a film to be processed 40 is formed (STEP 2) so that a hard mask layers (for example, 10, 20 and 30) consisting of a single layer or a plurality of layers are formed (STEP 3) to form a first resist layer (STEP 4). Not only the resist layer 70 but also the anti-reflective coating film 60 can be used for the first resist layer. In that case, forming a first pattern (70c in FIG. 3(A): STEP 5) in the first resist layer, a top view illustrated in FIG. 4(A) will be obtained. The hard mask layer 10 is etched by using this first pattern 70c. Thereby, a first pattern 10b is formed in the hard mask layer 10 (STEP 6 in FIG. 3(B)). This top view is illustrated by FIG. 4(B).

Subsequently, a second resist layer is formed on the hard mask layer 10 on which the first pattern is formed. The second resist layer is also formed by using the resist layer 70 and the anti-reflective coating film 60 likewise the first resist layer (STEP 7). On this second resist layer, the second pattern 70a is formed on the resist film 70 as in the top view illustrated in FIG. 4(C) (likewise FIG. 6(A)) (STEP 8). The second pattern 70a is a pattern including a first space b to divide the first pattern. With this second pattern 70a, size conversion trim etching is carried out under conditions to be described later. Thereby, a third pattern 10a is formed on the hard mask layer 10 (step 9 in FIG. 5(B)). FIG. 6(B) is a top view after forming the third pattern 10a and removing the second resist layer. That is, the state where the third pattern 10a made of the hard mask layer 10 is formed on the film to be processed according to STEP 1 to STEP 9. The third pattern 10a is a pattern including a second space c formed by the second pattern 70c on the first pattern 10b. This second space c is formed to be narrower than the first space b by the size conversion etching by using the second pattern 70c.

A third pattern 40a is formed (FIG. 5(C)) on the film to be processed 40 by processing the film to be processed 40 by using the third pattern 10a (STEP 10). Here, the second space c will be converted to the third space d; ideally, it is desired that the second space c is the same as the third space d in width. However, the width occasionally gets wide during etching the film to be processed. FIG. 6(C) is a top view of FIG. 5(C), illustrating the third pattern 40a formed of the film to be processed 40 and the gate insulating film 45 and the diffusion region 80 in the lower layer thereof. By the above described fabrication method using size conversion etching, the second space c is formed within device isolation region between diffusion regions without running on the diffusion region 80 by size conversion etching for carrying out size conversion to be described later.

In the present embodiment, a semiconductor substrate is used and a polysilicon film 40 is used as a wiring layer; an amorphous carbon film is used as a first hard mask layer 30; an Si film is used as a second hard mask layer 20; an SiOC film (25 nm) is used as a third hard mask layer 10; and film thickness of the anti-reflective coating film 60 is 65 nm. A resist 70 is formed on this anti-reflective coating film 60; this resist 70 undergoes trim exposure and development. Thereby, the second opening 100 with the space width b being 120 nm is formed (FIG. 5(A) and FIG. 7(A)). Next, using an etching apparatus of an ICP type, the anti-reflective coating film 60 and the SiOC film 10 undergo trim etching at CHF3 flow: 75 sccm/He flow: 75 sccm. Then the SiOC film 10 can be processed to attain the space width c of 104 nm (FIG. 5(B) and FIG. 7(B)). Etching the polysilicon film 40 with thus formed SiOC film 10a as a mask, the wiring layers 40a with the space width d of 106 nm are formed as an SRAM counter gate electrodes (FIG. 5(C) and FIG. 7(C)). In addition, the protrusion dimensional of the gate electrode end from the diffusion region 80 will become 47 nm.

However, in the actual fabrication steps, the trim exposure position, the trim exposure dimension and the position of diffusion regions vary within and/or among wafers. Therefore, the following four variable factors must be considered.
(1) Misalignment between the diffusion region 80 and the trim exposure position: maximum of 50 nm for the both sides (maximum of 25 nm for one side)
(2) With-in-wafer+wafer-to-wafer actual size dispersion of the diffusion region 80: 15 nm (maximum of 7.5 nm for one side)
(3) With-in-wafer+wafer-to-wafer actual size dispersion of trim exposure dimension b: 15 nm (maximum of 7.5 nm for one side)
(4) With-in-wafer+wafer-to-wafer actual dispersion of dimension d after trim etching of the wiring layer 40: 15 nm (maximum of 7.5 nm for one side)

The above described numeric values exemplify the present embodiment. Those numeric values are appropriately set corresponding to design rules and products.

It is unrealistic that all of the above described dispersion (1) to (4) occur to simultaneously. Therefore, in consideration of dispersion as sum of squares, it is considered that dispersion of 28 nm can occur on one side in the position of the gate electrode 40a and the position of the diffusion region 80. For example, when trim etching without any size conversion difference is carried out with the trim exposure dimension b being 120 nm, distance d between the SRAM counter gate electrodes after trim etching will also become approximately 120 nm. Including the dispersion of 28 nm for one side for consideration, the dimensional of the end of the gate electrode 40a protruding from the diffusion region 80 will become 11 nm for the distance of 200 nm between the diffusion regions 80.

Moreover, considering the case where the above described SRAM memory cell is shrunk to 90% in order to reduce bit costs, the distance between the diffusion regions 80 is shrunk to 180 nm. The dimensional of the end of the gate electrode 40a protruding from the diffusion region 80 will become mere 1 nm including the portion of dispersion of 28 nm for one side so that nearly all margin for fabrication will be lost. Moreover, in the case where a site where the end part of the gate electrode 40a runs on the diffusion region 80 occurs, a transistor loses its function so that the SRAM circuit can no longer operate.

Figure 8:
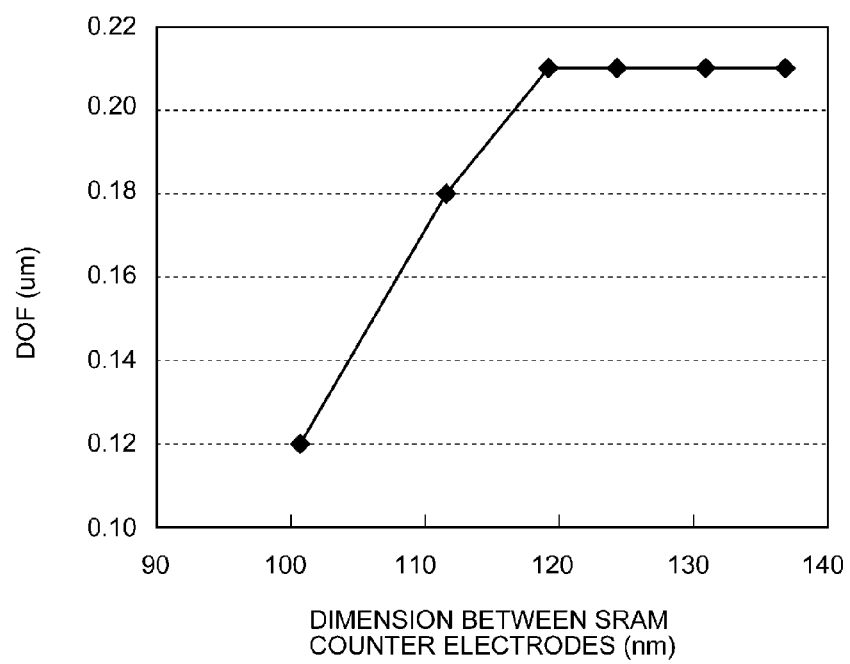
FIG. 8 is a graph illustrating relation between the dimension between SRAM counter electrodes and the depth of focus (DOF) in trim exposure.

Therefore, it is necessary to make the trim exposure dimension b of the resist 70a small. However, as illustrated in FIG. 8, an intension of making the trim exposure dimension b small to make the dimension d between the SRAM counter electrodes small gives rise to a problem of making the DOF small. According to the graph in FIG. 8, in the case where the DOF not smaller than 0.2 m is required for fabrication, the trim exposure dimension is required to be not smaller than minimum 120 nm. This trim exposure dimension is stipulated based on resolution of exposure apparatuses, resulting in, therefore, much larger dimension.

Therefore, size conversion trim etching is carried out to make the trim exposure dimension d of the third hard mask layer smaller than the trim exposure dimension b of the resist to carry out etching with this third hard mask layer as a mask. Thereby, it is possible to make the dimension d between the SRAM counter gate electrodes 40a be 106 nm for 120 nm of the trim exposure dimension b. In addition, the dimensional of the end part of the SRAM counter gate electrode 40a protruding from the diffusion region 80 can be 8 nm.

Figure 11:
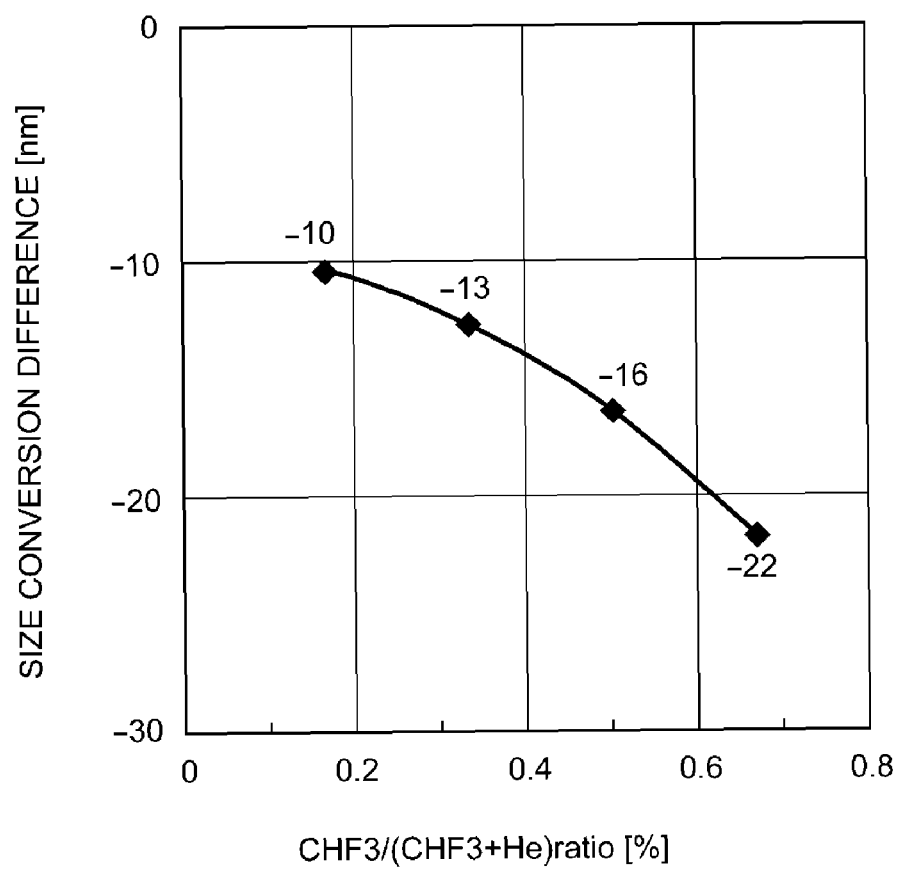
FIG. 11 is a graph illustrating the relation between size conversion difference (changing of dimension from resist pattern into etched hardmask) and the flow rate of etching gas.

FIG. 11 is a graph illustrating the relation between size conversion difference, which is the difference between the trim exposure dimension b of the resist and the exposure dimension c of the third hard mask layer 10a after trim etching, and the flow rate of CHF3 and He, which are etching gas. For example, by changing CHF3:He from 75:75 sccm to 150:50 sccm, the size conversion difference can be changed from 16 nm to 22 nm. Accordingly, larger dimensional of the end of the gate electrode 40a protruding from the diffusion region 80 can be taken.

Figure 12:
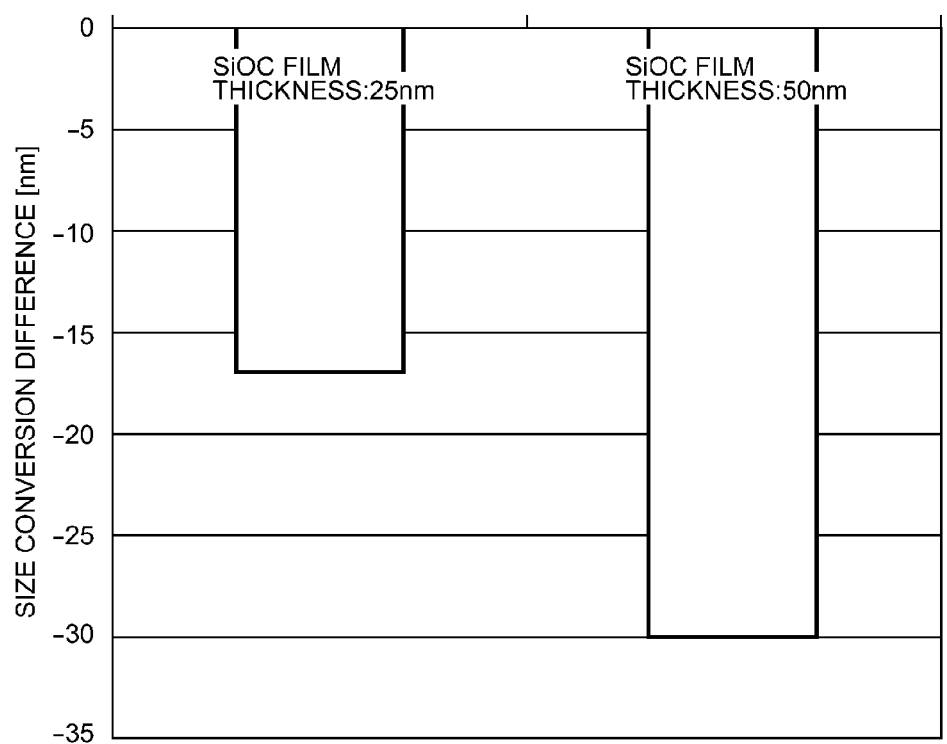
FIG. 12 is a graph illustrating the relation between film thickness of a hard mask layer and size conversion difference.

FIG. 12 is a graph expressing the size conversion difference (nm) in the case where CHF3 flow: 75 sccm/He flow: 75 sccm is used as the etching gas and the third hard mask layers 10 having film thicknesses of 25 nm and 50 nm undergo trim etching. In the case of trim-etching the hard mask layer 10 with 25 nm film thickness, the size conversion difference (b–c) can be approximately 17 nm. In the case of using the hard mask layer 10 with 50 nm film thickness, the size conversion difference (b–c) can be approximately 30 nm.

For the present embodiment, SiOC is used as the third hard mask layer 10. However, materials besides SiOC, that is, SiO2, SiON, SiN, SiC and SiOF, SiCN for example, can be used. Also in the case of using those materials, trim etching is possible likewise the case of using SiOC. Moreover, in the present embodiment, mixed gas of CHF3 and He is used. However, another etching gas can be used. Such etching gas includes CHF3 or CH2F2 or mixed gas thereof. In addition to the etching gas hereof, one or more kinds of gases selected from He, Ar, O2, N2 and CF4 can be used.

A film-like deposit is confirmed to be formed on the side of the etching face of the anti-reflective coating film 60a and the hard mask layer 10a when the anti-reflective coating film 60 and the hard mask layer 10 undergo etching with gas of the hydrofluorocarbon system such as the CHF3 gas and the CH2F2 gas. This deposit is considered to consist of polymer including fluorocarbon supplied from the etching gas. The thus obtained deposit functions as a film for protecting the hard mask layer 10a. As etching progresses deeply, fine processing goes on to obtain a tapered concave part at last.

Thus, the size conversion difference depends on types and flow rate of the etching gas, film thickness of the hard mask layer and the like. Accordingly, by changing those conditions, a desired space width can be obtained.

Here, a method of setting an etching condition of a size conversion will be described. As preparation for setting, the relation between the constitution ratio of gas and the size conversion difference illustrated in FIG. 11, for example is obtained. In addition, the limit experimental value of exposure of the second pattern for isolating the gate line with space b is obtained. Here, the setting values for the diffusion region, the gate line width and the gate line isolation width are determined corresponding to design rules and products. Therefore, the obtained limit value of exposure and the isolation width of the gate line are brought into comparison to determine a required size conversion quantity. An appropriate gas constitution ratio is determined from the required size conversion quantity based on FIG. 11.

The size conversion difference can be adjusted not only by the gas constitution ratio but also by the film thickness of the hard mask as described with FIG. 12. Accordingly, the data of the film thickness of the hard mask and the size conversion difference in FIG. 12 are obtained in advance. Thereby, appropriate film thickness of the hard mask can be determined from a required size conversion quantity based on FIG. 12 as well. The relation between the hard mask film thickness and the size conversion difference is illustrated in FIG. 12. Moreover, also in the case of changing the film thickness of the anti-reflective coating film, the likewise relation is obtainable. That is, the relation is that the size conversion difference gets larger as the film thickness of the anti-reflective coating film included as the second resist layer is larger and larger.

Third Embodiment

Figure 14:
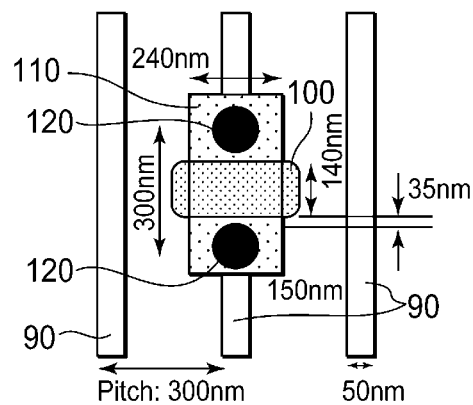
FIGS. 14(A1), (A2), (B1), (B2), (C1) and (C2) illustrate explanatory diagrams of a method of fabricating a semiconductor device of the third embodiment of the present invention.
Figure 14:
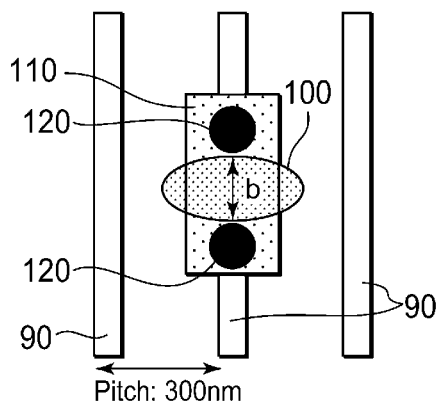
Figure 14:
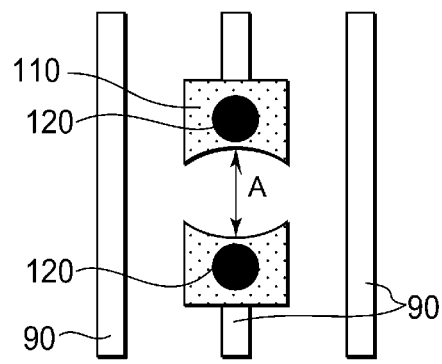
Figure 14:
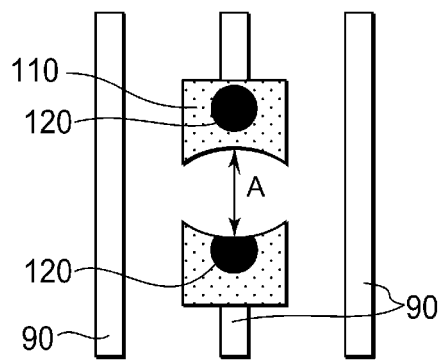
Figure 14:
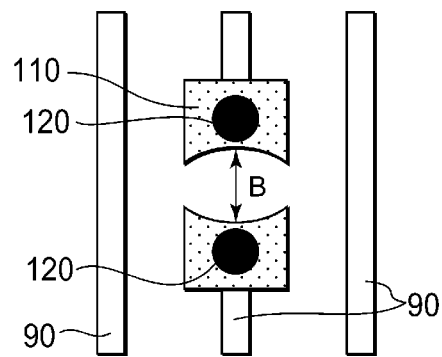
Figure 14:
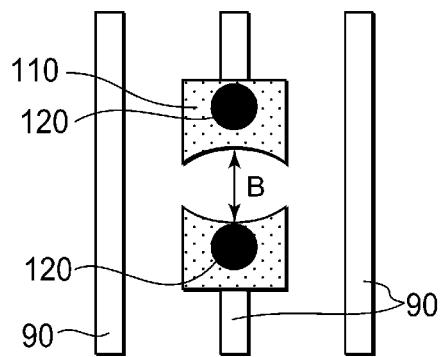
Figure 15A:
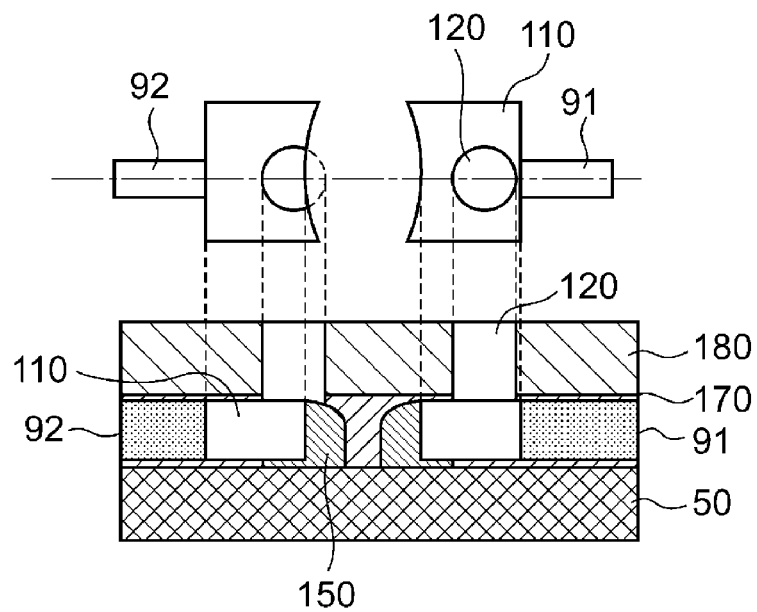
FIG. 15(A) is a diagram illustrating FIG. 14(B2) together with a cross-sectional view.
Figure 15B:
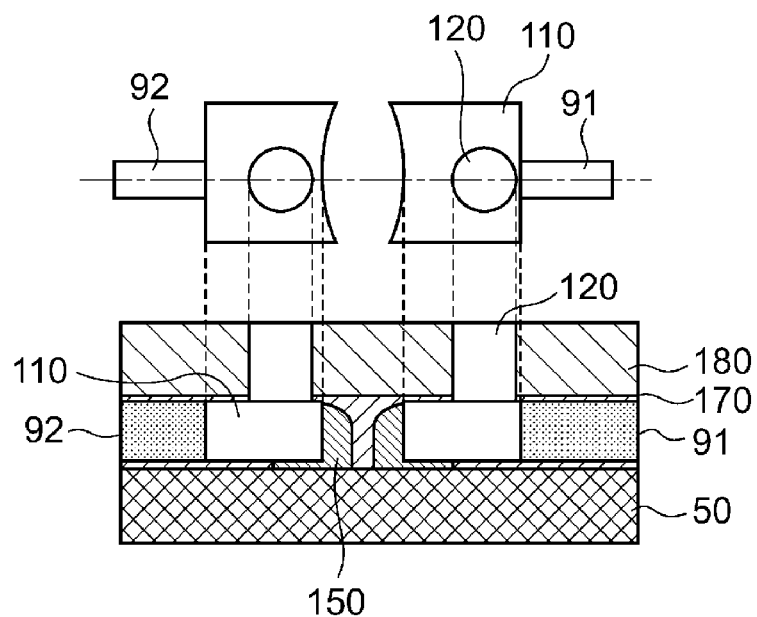
FIG. 15(B) is a diagram illustrating FIG. 14(C2) together with a cross-sectional view.

In the present embodiment, a method of applying size conversion etching to the contact hole forming region 110 of the gate line 90 will be described. The contact forming region 110 is formed as a pad corresponding with necessity in accordance with the width of the gate line 90 and the size of the contact hole 120. For the present embodiment, the gate lines 90 and a contact pad 110 are provided on a substrate 50 as illustrated in FIG. 14. Contact holes 120 are provided on the contact pad 110. An SiN interlayer film and an SiO2 interlayer film are present so as to cover those contact pad 110 and contact holes 120. Also for the present embodiment, trim etching is carried out by using the hard mask layer, the anti-reflective coating film and the resist likewise the first embodiment.

Figure 13:
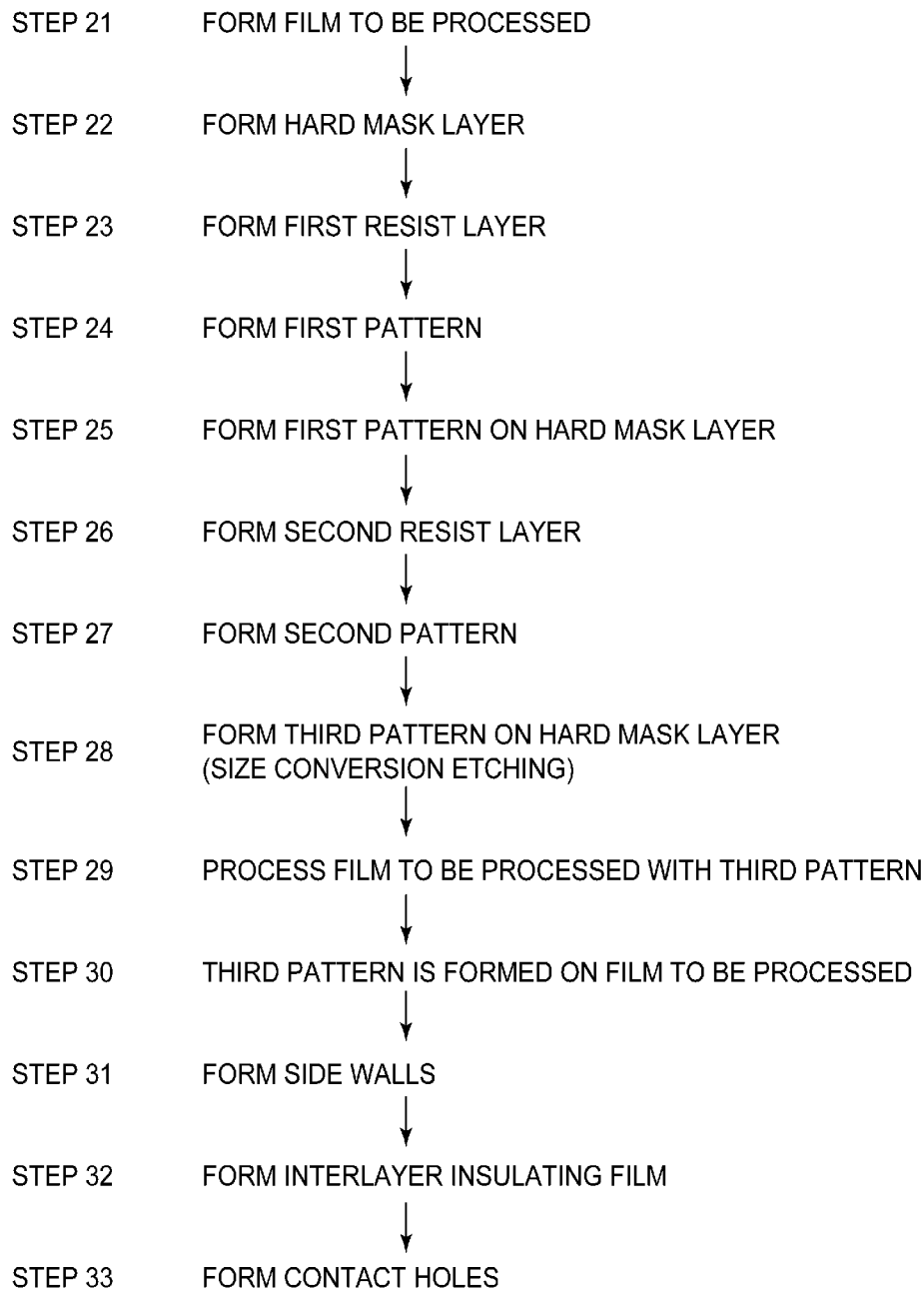
FIG. 13 is a process flow chart of a third embodiment of the present invention.

A flow chart of the method of fabricating the semiconductor device of the present embodiment is illustrated in FIG. 13. A film to be processed for forming the lower wiring such as the gate line is formed on the substrate. A first pattern is formed on the hard mask layer by using the first pattern formed on the first resist layer formed on the film likewise the first embodiment as a mask (STEPS 21 to 25). A second pattern (opening 100) including a first space for carrying out isolation as the first wiring and the second wiring is formed on the second resist layer (STEPS 26 and 27). size conversion trim etching is carried out by using this second pattern (opening 100) as a mask to form a third pattern on the hard mask layer. This size conversion etching will form a second space, which is shrunk from the first space of the second pattern (opening 100), in the third pattern (STEP 28). The film to be processed undergoes further etching by using the hard mask in which the third pattern has been formed. The third pattern is formed on the film to be processed and first wiring 91 and second wiring 92 are formed (STEP 29).

Subsequently, side wall for the gate line is formed (STEP 31) and the interlayer insulating film is formed (STEP 32). Such as ion implantation for forming transistors is appropriately carried out between the STEP 31 and the STEP 32. The contact holes connected to the first wiring and second wiring isolated by the mask including the second space are opened, embedded with a metal film and connected to the upper layer wiring. (STEP 33) As described above, size conversion trim etching is carried out. Thereby, the alignment margin at the occasion of forming the contact holes increases so that an increase of contact resistance can be suppressed.

FIG. 14(A1) is a drawing illustrating a trim exposure in the ideal state. Here, the pitch of the gate line 90 is 300 nm. The trim exposure pattern opening 100 is rectangular and is located in the center of the contact pad 110. In the case where the diameter of the contact hole 120 is 90 nm; the pitch is 300 nm; the shorter axis dimension of the trim exposure pattern opening 100 is 140 nm, the distance between the end of the trim exposure pattern opening 100 and the end of the contact hole 120 is 35 nm as illustrated in FIG. 14(A1).

However, the trim exposure pattern opening 100 is ellipsoidal as illustrated in FIG. 14(A2) in the actual trim exposure. FIG. 14(A2) is a drawing illustrating the case where the trim exposure pattern opening 100 in FIG. 14(A1) is ellipsoidal. Moreover, actually, displacement of the trim exposure pattern opening 100 and with-in-wafer/wafer-to-wafer dispersion of positions of the respective member are present. Therefore, the following six items has to be considered.
(1) Displacement of the position of the trim exposure pattern opening 100 of the contact pad 110 and the resist: Maximum 50 nm for the both sides (maximum of 25 nm for one side)
(2) Displacement of the trim exposure pattern opening of the contact pad 110: Maximum 50 nm for the both sides (maximum of 25 nm for one side)
(3) With-in-wafer+wafer-to-wafer dispersion range of the trim exposure pattern opening 100: 15 nm (maximum of 7.5 nm for one side)
(4) With-in-wafer+wafer-to-wafer dispersion range of the dimension after trim etching of the resist: 15 nm (maximum of 7.5 nm for one side)
(5) With-in-wafer+wafer-to-wafer dispersion range of trim exposure position of the contact pad 110: 10 nm (maximum of 5 nm for one side)
(6) With-in-wafer+wafer-to-wafer dispersion range of the dimension after etching the contact holes 120: 10 nm (maximum of 5 nm for one side)

The above described numeric values exemplify the present embodiment. Those numeric values are appropriately set corresponding to design rules and products.

Figure 9A:
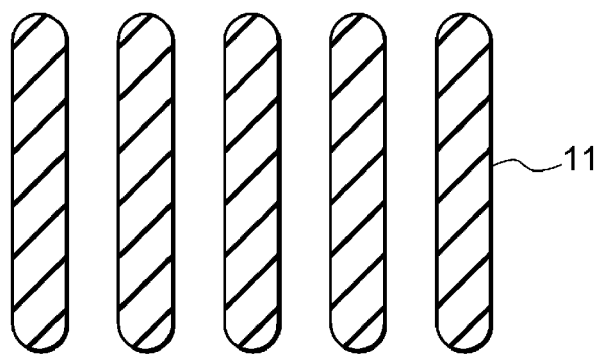
FIG. 9(A) and FIG. 9(B) are plan views illustrating a method of fabricating a conventional semiconductor device.
Figure 9B:
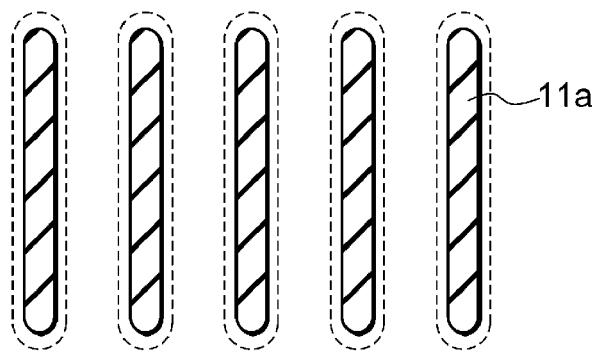

It is unrealistic that all of the above described dispersion (1) to (6) occur simultaneously. Therefore, in consideration of dispersion as sum of squares, it is considered that dispersion of 38 nm can occur on one side in the position of the trim exposure opening 100. For example, when etching without any size conversion difference is carried out with the trim exposure dimension b being 140 nm, the contact pad 110 is etched only for approximately 140 nm as illustrated in FIG. 14(B1) so that the contact holes 120 are left without considering the portion of dispersion. Here, in FIG. 14(B1), the etched dimension A is nearly equal to the trim exposure dimension b. However, in the case where dispersion of 38 nm for one side in the trim exposure position is present, 3 nm of the contact hole 120 will be trimmed as illustrated in FIG. 14(B2) and FIG. 9(A) so that the gate/contact resistance will increase.

Therefore, size conversion etching for processing to attain a size smaller than the trim exposure dimension b is used. Here, trim etching is carried out to make the exposure space width A be 140 nm and the etching width B of the contact pad 110 be 120 nm. In the case where no displacement is present in the trim exposure position 100, the contact hole 120 and the contact pad 110 (FIG. 14(C1)), sufficient distance between the end of the contact pad 110 and the end of the contact hole 120 is present. In addition, as illustrated in FIG. 14(C2), also in the case where dispersion of 38 nm for one side is present, the distance between the end of the contact pad 110 and the end of the contact hole 120 is present. Accordingly, the increase of the gate/contact resistance can be suppressed. Moreover, also in the case where the distance between the contact holes 120 is small, the increase of the gate/contact resistance due to trimming of the contact pad can be prevented.

The etching dimension B can be controlled by applying the method disclosed in the first embodiment or the second embodiment and by changing the anti-reflective coating film to be used, film thickness of the hard mask layer and the etching gas.

The method of setting an etching condition of a size conversion in the third embodiment is carried out likewise the second embodiment. The isolation width of the gate line in the contact hole forming region is obtained from the design data. The obtained limit value of exposure and the isolation width of the gate line are brought into comparison to determine a required size conversion quantity. Then an appropriate etching condition is determined from the relationship between the size conversion difference and the gas constitution ratio or the film thickness of the second resist layer as indicated in FIG. 11 or 12.

So far, embodiments of the present invention have been described with reference to the drawings. However, those embodiments exemplify the present invention and various configurations can be adopted besides the above described configurations as to isolation of wiring patterns in multilayer wiring and the like.

What is claimed is:
1. A method of fabricating a semiconductor device, comprising the steps of:
   forming a film to be processed on a substrate;
   forming a hard mask layer and a first resist layer on the film to be processed;
   forming a first pattern on the first resist layer;
   etching the hard mask layer by using the first pattern as a mask;
   forming a second resist layer on the hard mask layer;
   forming a second pattern including a first space on the second resist layer for isolating the first pattern;
   forming a third pattern including a second space shrunk from the first space on the hard mask layer by carrying out size conversion etching by using the second pattern formed on the second resist layer as a mask;
   etching the film to be processed by using the third pattern formed on the hard mask layer to form a first wiring pattern and a second wiring pattern;
   forming an interlayer insulating film on the film to be processed; and
   forming a first and a second contact holes bringing the first wiring pattern and the second wiring pattern respectively into connection to the interlayer film.

2. The method of fabricating a semiconductor device according to claim 1, wherein the third pattern is a gate electrode pattern.

3. The method of fabricating a semiconductor device according to claim 1, wherein the third pattern includes a pad in a contact hole forming region; and a second space of the second pattern is formed in the pad portion.

4. The method of fabricating a semiconductor device according to claim 1, wherein an anti-reflective coating film is formed on the hard mask layer.

5. The method of fabricating a semiconductor device according to claim 1, wherein the hard mask layer includes at least one kind selected from SiOC, SiO2, SiON, SiN, SiC, SiOF and SiCN.

6. The method of fabricating a semiconductor device according to claim 1, wherein etching gas used in the size conversion etching step on the hard mask layer is fluorocarbon gas expressed by $C_xH_yF_z$ (x=1 to 5, y=0 to 3, z=1 to 8) or its mixture.

7. The method of fabricating a semiconductor device according to claim 6, wherein the fluorocarbon gas is at least one gas selected from CHF3 or CH2F2.

8. The method of fabricating a semiconductor device according to claim 6, wherein the etching gas further includes at least one selected from the group consisting of He, Ar, O2, N2 and CF4.

* * * * *